United States Patent
Pecorino et al.

(10) Patent No.: US 10,433,439 B2
(45) Date of Patent: Oct. 1, 2019

(54) COVER FOR AN ULTRA-FLAT PANEL DISPLAY

(71) Applicants: Philip Pecorino, Bayville, NY (US); Aldo Medaglia, Roslyn, NY (US)

(72) Inventors: Philip Pecorino, Bayville, NY (US); Aldo Medaglia, Roslyn, NY (US)

(73) Assignees: Philip Pecorino, Bayville, NY (US); Aldo Medaglia, Roslyn, NY (US)

( * ) Notice: Subject to any disclaimer, the term of this patent is extended or adjusted under 35 U.S.C. 154(b) by 0 days.

(21) Appl. No.: 15/706,001

(22) Filed: Sep. 15, 2017

(65) Prior Publication Data

US 2018/0084659 A1     Mar. 22, 2018

Related U.S. Application Data

(60) Provisional application No. 62/396,576, filed on Sep. 19, 2016.

(51) Int. Cl.
| | |
|---|---|
| *H05K 5/00* | (2006.01) |
| *H05K 5/02* | (2006.01) |
| *G09F 11/08* | (2006.01) |
| *G09F 11/10* | (2006.01) |
| *H05K 5/03* | (2006.01) |
| *E06B 9/40* | (2006.01) |
| *H04N 5/645* | (2006.01) |

(52) U.S. Cl.
CPC ............ *H05K 5/0243* (2013.01); *E06B 9/40* (2013.01); *G09F 11/08* (2013.01); *G09F 11/10* (2013.01); *H05K 5/03* (2013.01); *H04N 5/645* (2013.01)

(58) Field of Classification Search
CPC ........................................................ H05K 5/00
USPC .................................................... 361/679.01
See application file for complete search history.

(56) References Cited

U.S. PATENT DOCUMENTS

| | | |
|---|---|---|
| 2,553,965 A | 7/1945 | Gist |
| 2,668,586 A | 2/1954 | Luckie |
| 3,222,018 A * | 12/1965 | Masters ................. A47G 1/215 |
| | | 211/87.01 |
| 3,436,138 A | 4/1969 | Ressler |
| 3,852,514 A | 12/1974 | Lauben |

(Continued)

OTHER PUBLICATIONS

International Search Report and Written Opinion for International Patent Application No. PCT/US2017/052223 dated Dec. 28, 2017. 10 pages.

(Continued)

*Primary Examiner* — Jerry Wu
(74) *Attorney, Agent, or Firm* — Leason Ellis LLP

(57) ABSTRACT

An improved cover unit for thin flat display panels provides consumers with the ability to purchase and install a cover unit without the aid of a skilled technician. The cover unit is for use with flat panel displays, including ultra-thin displays, which are thin and lightweight. The cover unit is secured to a wall with mounting brackets, and has a housing that supports the frame, display unit, a matte and a roller on which a cover is mounted. The cover has artwork on it, which is displayed when it is rolled down to conceal the flat display panel, but which can be rolled up out of the way when the display unit is in operation. The matte allows for a single cover unit to accommodate a variety of display screen and artwork sizes. In this system, the roller, display unit and matte are easily inserted and removed from the housing.

16 Claims, 10 Drawing Sheets

(56) References Cited

U.S. PATENT DOCUMENTS

| | | | |
|---|---|---|---|
| 4,103,204 | A | 7/1978 | Credelle |
| 4,143,296 | A | 3/1979 | Stanley |
| 5,007,608 | A | 4/1991 | Carroll |
| 5,138,462 | A | 8/1992 | Skovgaard |
| 5,264,765 | A | 11/1993 | Pecorino et al. |
| 5,783,005 | A | 7/1998 | Handler |
| 6,901,987 | B1 | 6/2005 | Graham |
| 6,975,308 | B1 | 12/2005 | Bitetto et al. |
| 8,553,160 | B1 | 10/2013 | Fowler |
| 2004/0064986 | A1 | 4/2004 | Anderson |
| 2007/0051861 | A1 | 3/2007 | Teramachi et al. |
| 2007/0052872 | A1* | 3/2007 | Vermeulen ........... A47B 81/065 348/787 |
| 2008/0049400 | A1* | 2/2008 | Pecorino ................. H04N 5/64 361/724 |

OTHER PUBLICATIONS

American Builder, Only Screen Exposed in this Television Wall Installation, Feb. 1952, vol. 74, No. 2, 3 pages.
Electric Home Television, Kansas City's First All-Electric Home Brochure, 1954, 4 pages.
Popular Mechanics, Thin Tube Foretells Wall TV and Sky View for Air Pilot, 1958, 3 pages.

* cited by examiner

COVER FOR AN ULTRA-FLAT PANEL DISPLAY

CROSS-REFERENCE TO RELATED APPLICATION

The present application claims priority to U.S. Provisional Patent Application No. 62/396,576, entitled COVER FOR AN ULTRA-FLAT PANEL DISPLAY, filed on Sep. 19, 2016, the contents of which are hereby incorporated by reference as if set forth expressly in its entirety.

FIELD OF THE INVENTION

The present invention relates to a display cover for a flat screen video display unit that is mounted to a wall, and particularly to an art cover unit for an ultra-flat panel display which can be purchased off the shelf, easily installed by a consumer, and used with a variety of different sized ultra-flat panel displays.

BACKGROUND OF THE INVENTION

The use of flat panel video displays, such as flat panel televisions, has become increasingly widespread. Flat panel televisions are becoming more and more affordable for consumers as the technology improves. In addition, the variety of sizes of the displays of these flat panel televisions has increased significantly. As a result, more and more consumers are purchasing flat panel televisions of different sizes.

Advances in the manufacturing of flat panel video displays provide for reductions in the cost and thickness of the flat panel video displays. Several years ago flat panel video display televisions cost thousands of dollars. Today they cost hundreds of dollars.

The new thin video displays are known as "ultra-flat panel displays," and can range from a fraction of an inch to a few inches in thickness. Such displays typically have screen sizes that range from approximately 14 inches to 85 inches diagonally. However, the sizing of the ultra-flat panel displays is fairly uniform in the industry, with common screen sizes, such as 14 inches, 19 inches, 24 inches, 28 inches, 32 inches, 40 inches, 43 inches, 48 inches, 50 inches, 55 inches, 60 inches, 65 inches, 70 inches, 75 inches, 78 inches, and 85 inches. For example, the Samsung UN24H4000 is advertised as a 24-inch flat panel video display that is only 1.9 inches thick and 8.6 pounds (http://www.samsung.com/us/system/consumer/product/un/24/h4/un24h4000afxza/H4000_SpecSheet_7_29_14_1.pdf). Similarly, the Sony XBR-75X910C is advertised as a 75-inch flat panel video display that is only 1.97 inches thick and 74.30 pounds (http://www.sony.com/electronics/televisions/xbr-x910c-x900c-series/specifications). While these flat panel video displays are thin and relatively light in weight, even thinner products are being developed. These newly offered flat display panels are advertised as being as thin as 0.1 inch thick. As this industry develops, flat display panels will continue to be designed thinner and lighter.

Most consumers would prefer not to see flat screen displays in their homes when they are turned off because they appear to be large grey or black boxes hanging on the walls of their bedrooms, living rooms, or kitchens. It is also not practical for the consumer to have the flat panel television remain turned on displaying a picture when the device is not being watched, because this will significantly reduce the lifespan of the display unit. Therefore, it is desirable to cover the screen of the flat panel display with an aesthetically pleasing piece of artwork, such as a print or embroidery, when the display unit is not in use, so as to conceal or disguise the display unit.

U.S. Pat. No. 5,264,765 ("the '765 patent") describes a cover that can be placed over a flat panel video display screen to provide the consumer with a more aesthetically pleasing look when the display screen is not in use. For example, a configuration according to the '765 patent includes a frame supporting an art canvas print, which conceals the flat screen display. A motorized roller enables the art work to move upward to reveal the flat panel display and downward to cover it. A control for the motor may be activated by a remote control used to turn the flat panel display on and off. Devices made according to this patent have sold for thousands of dollars each. This was a reasonable expense to improve home aesthetics when the cost of the television was even greater. However, with the drop in the cost of the television, purchase of such devices becomes a more difficult choice.

Further, it is burdensome for the consumer to obtain and install the cover described in the '765 patent. A consumer cannot walk into a retail store and purchase a display unit and an accompanying cover. Instead, the consumer must custom order the art print, as well as the art frame cover, based on the size of the display screen. Furthermore, the consumer must have the cover custom-installed by technicians who are skilled in both carpentry, and audio and video technology. This results in an order and installation process that is very expensive and time consuming for the consumer who wishes to use such a cover, over and above the cost of the cover unit itself.

The flat panel video displays described in the '765 patent are also thicker and heavier than the ultra-thin flat panel video displays offered today. Because of their size and weight, the housing that held the flat panel video display in the '765 patent was large and required careful installation so as to ensure that the wall could support the weight of the cover unit and flat panel video display. The '765 patent also disclosed mounting the cover unit in a recess in a wall to hide some of the thickness of the flat panel display. This required a technician or carpenter to cut a hole or create a recess in the wall. The effect was to restrict the homeowners' ability to move the cover unit to another location in their house. Because the current ultra-thin flat panel video displays are so thin, there is no need to try to conceal their thickness.

The cover unit described in the '765 patent also was not amenable to a customer easily changing out the flat panel video display or the art work in the cover unit. Because of the custom sizing and design of the cover unit, a technician would be needed to make any changes of this kind.

Another type of decorative covering and apparatus is disclosed in U.S. Pat. No. 6,901,987 ("the '987 patent"). Similar to the '765 patent, the '987 patent relates to a cover unit for a flat panel display where a type of decorative covering can conceal the flat panel display when it is not in use. The '987 patent discloses a system wherein the decorative covering is revealed through the use of two rollers.

Similar to the '765 patent, the '987 patent does not contemplate the use of ultra-thin flat display panels. The cover unit disclosed in the '987 patent has sold for thousands of dollars each, and must be custom made and installed by a trained technician. The artwork in this unit is not easily changed by the customer. Also, the combination of the flat display panel and cover unit is not easily moved by the customer.

United States Patent Publication No. 2008/0049400 ("the '400 publication) attempted to solve some of the issues with the '765 patent. The '400 publication describes a flat screen display cover unit that is mounted to a wall and includes a matte that is disposed within the cover unit. Use of the matte allows for a single-size art frame to accommodate a variety of different flat panel screen sizes and art print sizes. While the '400 publication allows a single cover unit to be used with a variety of flat panel screen and art print sizes, it does not solve any of the other problems described above for the '765 and '987 patents.

Thus, there is a need for an alternative, which can provide the same aesthetically pleasing look while still being cost-effective and easy to use for consumers. In particular, there is the need for a product that consumers can purchase off-the-shelf for less than the thousands of dollars paid for prior art covers and install themselves, without the need for any custom made parts or installation assistance by a trained technician. There is also a need to allow consumers to easily change out the art work and move the entire display and cover unit at will, without the need for a trained technician.

SUMMARY OF THE INVENTION

The present invention is an improvement in the art for cover units for video display panels. Because the ultra-thin video display units offered today are lighter in weight, the present invention discloses a system that is lightweight and easy to install. Further, the cover unit of the present invention is low in cost, adapts easily to a variety of different size display units, has an art roller assembly that can be changed by the consumer and which can easily be mounted or moved by the consumer.

One illustrative embodiment of the cover unit of the present invention includes mounting brackets or a mounting bar that supports the weight of the entire cover unit. The mounting bracket(s) or mounting bar is easy to install on a wall by a consumer with anchor bolts or other securing means. The housing for the cover unit is mounted on the brackets or bar, and includes a roller mount to receive a roller, a grooved channel to receive a matte and display panel, and a cover channel to allow for a cover with artwork to be rolled up and down in front of the display panel. Decorative front and side pieces, such as a frame, may be added to the housing. The roller within the housing can be easily snapped or slid into place through the top or side of the housing. This allows the consumer to change out the cover or artwork at will. The matte allows for off-the-shelf purchase of the cover unit, and ensures that only the screen of the display unit or the artwork on the cover is viewable. This allows the consumer to use the same cover unit with multiple sizes of display units or artwork, only having to change or cut the matte. The design of the housing further permits consumers to easily insert and remove the display unit and matte. Also, the roller is controlled by a motor that rotates the roller in one direction or the other in response to a control signal, perhaps from a television remote control unit or similar device.

This invention represents a major step in allowing consumers to purchase inexpensive off-the-shelf cover units that do not require custom manufacturing or installation.

BRIEF DESCRIPTION OF THE DRAWINGS

The foregoing and other objects and advantages of the present invention will become more apparent when considered in connection with the following detailed description and appended drawings in which like designations denote like elements in the various views, and wherein.

DETAILED DESCRIPTION OF EXEMPLARY EMBODIMENTS OF THE INVENTION

The current invention is a cover unit for a flat panel display, particularly an ultra-flat panel video display, (also referred to herein as a "display unit" or "display panel").

According to one aspect of the present invention all of the necessary components of a cover unit for a display panel can be purchased from a retail store or easily ordered by the consumer. Once purchased at a retail store, the store staff can assemble the unit and the customer would only need to mount the unit on their wall. Or, such an assembly is simple enough that the customer can put the unit together at their own home. The display cover would be inexpensive and easily adaptable to show new art or to be located in a new position.

Figure 1:
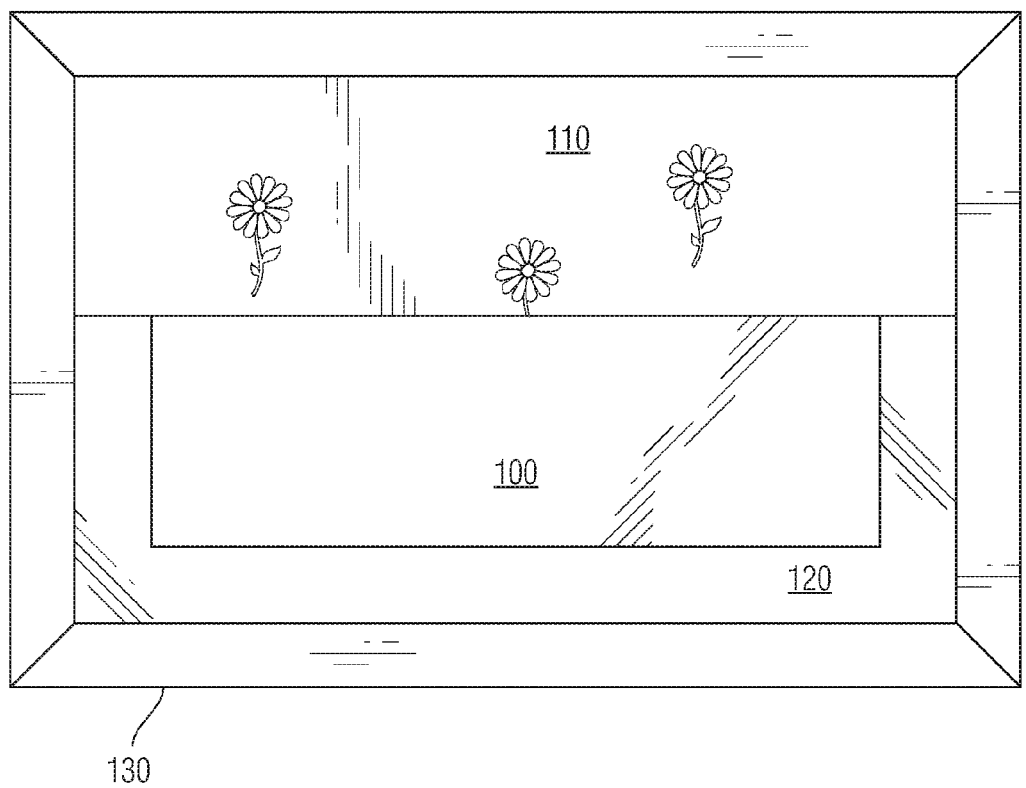
FIG. 1 is a front view of an assembled cover unit according to the present invention.

As shown in the front view of FIG. 1 an ultra-thin flat display panel 100 with a matte 120 can be mounted within a housing 200 that has a frame 130. The screen of the display panel 100 can be concealed and revealed by a cover 110 that has an image or design on it. The cover 110 can be rolled up or down to expose or conceal the screen without doing any damage to the cover 110 or display screen of the display panel 100. To facilitate the up and down movement of the cover 110 to reveal and conceal the screen, it is wrapped about a roller 115 as shown in FIG. 2.

Figure 2:
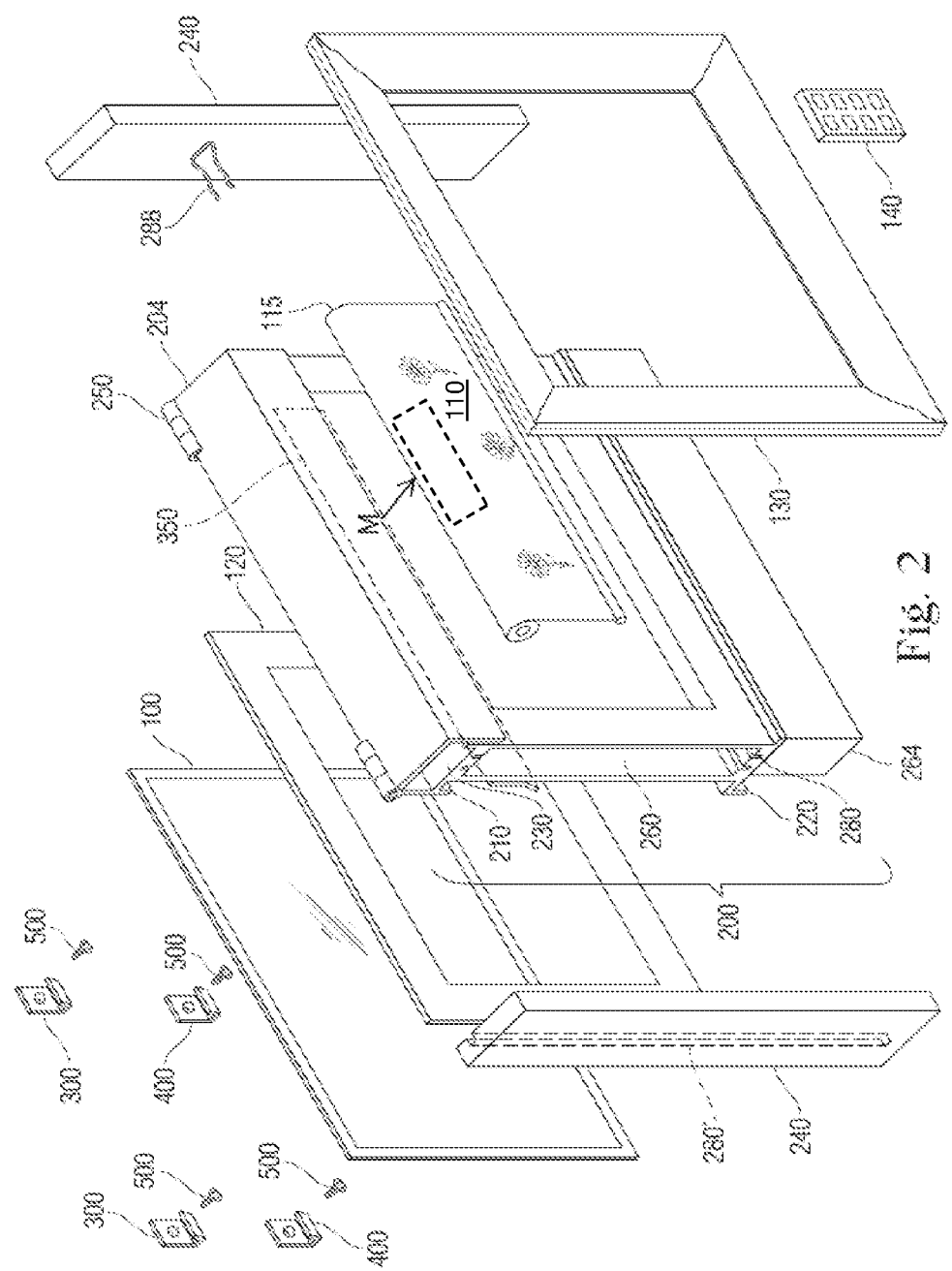
FIG. 2 is an exploded perspective view of the present invention according to a first embodiment with four mounting brackets.

The housing 200 as further shown in FIG. 2 is lighter than the steel and thick aluminum used in the designs according to the '765 Patent and is composed of less material than the housing disclosed in the '765 patent. Because the ultra-thin display units are lighter and thinner, the housing is able to be lighter and thinner as well. The reduction in weight and size of the housing allows for simple customer installation.

The housing 200 has a generally rectangular shape with a front surface and a rear surface separated by a portion of the housing, so that it is relatively thin. The housing has channels or slots 280 in upper and lower platforms 284, 285 for the matte and display unit. See FIG. 3. The roller 115 is in a roller mount space 230 and the cover moves over the front surface of the housing. The housing has a lower portion 264 which can contain power supplies 271 or wires in a space 266.

Figure 3:
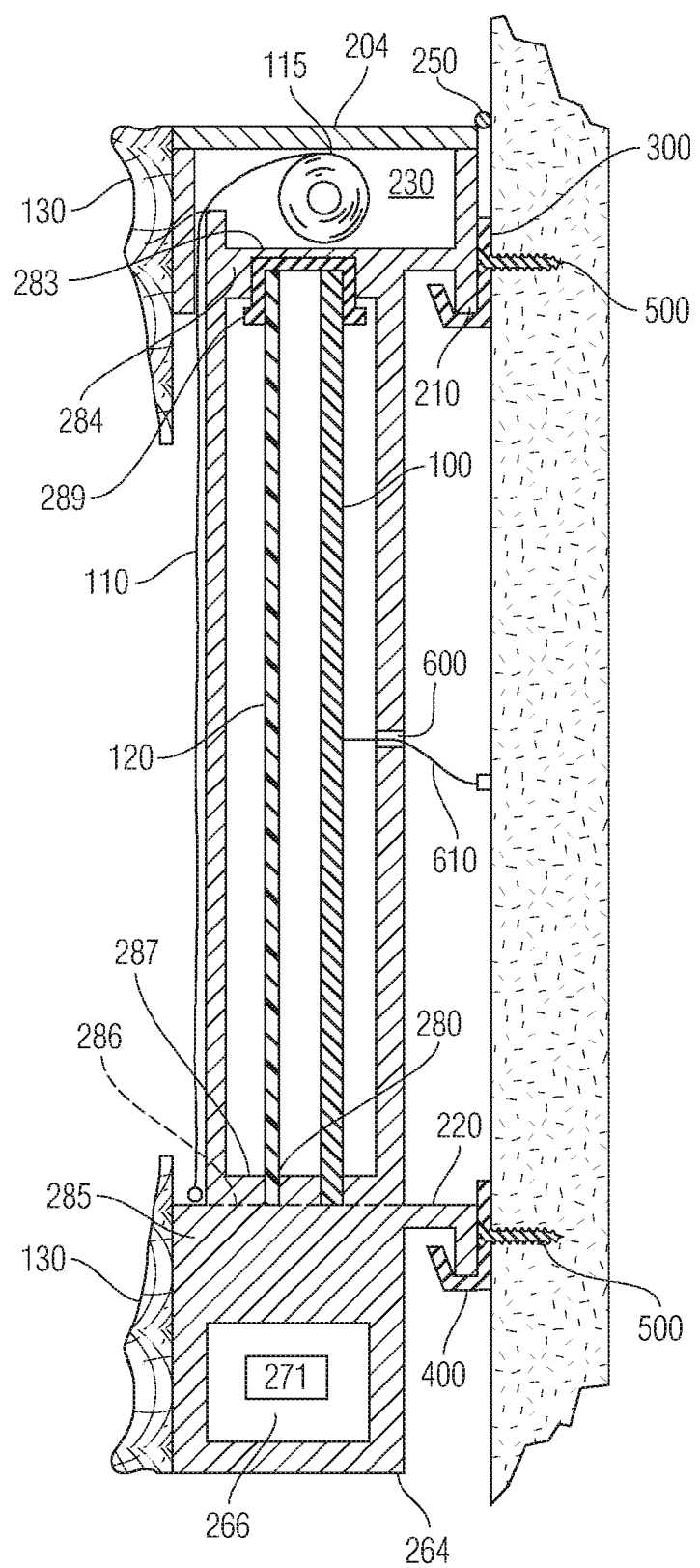
FIG. 3 is a cross-sectional view of a side elevation of the present invention according to the first embodiment with four mounting brackets.
Figure 8A:
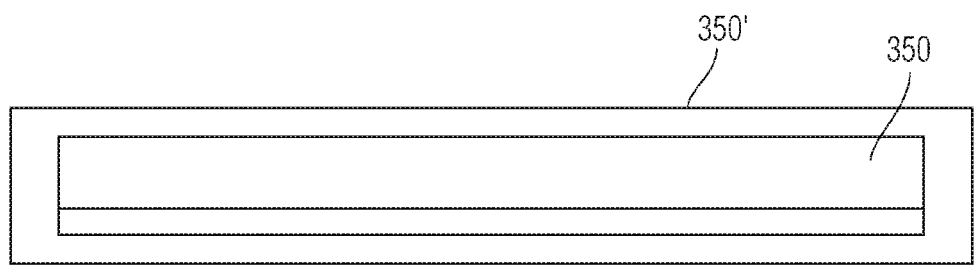
FIG. 8A is a front view of a mounting bar according to a further embodiment.
Figure 8B:
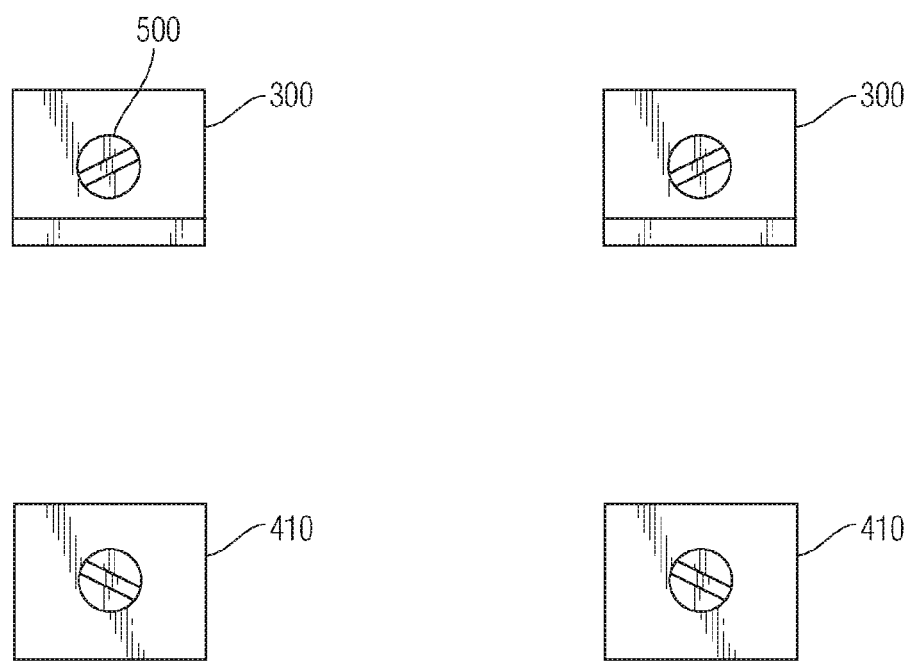
FIG. 8B is a front view of mounting brackets and blocks according to the second embodiment.

In a first embodiment, as shown in FIGS. 2 and 3, mounting brackets 300 and 400 are located on the four corners of the housing. These mounting brackets can be anchored into a wall with screws, bolts or other similar securing mechanisms 500. See also FIG. 8B. See FIG. 3. Other hanging mechanisms, such as using wire or clips on the housing, can be used. The mounting brackets 300 and 400 support the weight of the entire cover unit system, including the flat display panel, and are easy to install by a consumer or retailer. Alternatively, a mounting bar 350 or other device for mounting can be used. The mounting brackets 300 and 400 or bar 350 are of equal depth so as to hold the housing at equal distances on all sides from the wall on which it is mounted. In the present invention, at least the two upper mounting brackets 300 or the mounting bar bear the weight of the entire cover unit system, which includes at least the housing 200, frame 130, display unit 100, roller 115, and matte 120. Where a mounting bar 350 is used, it may extend across the rear surface of the housing and mount to a further mounting bar 350' on a wall, as shown in FIG. 8A. As a further alternative, the flat display panel can be separately mounted to the wall with the cover unit mounted over it and separately mounted on the wall.

Figure 4:
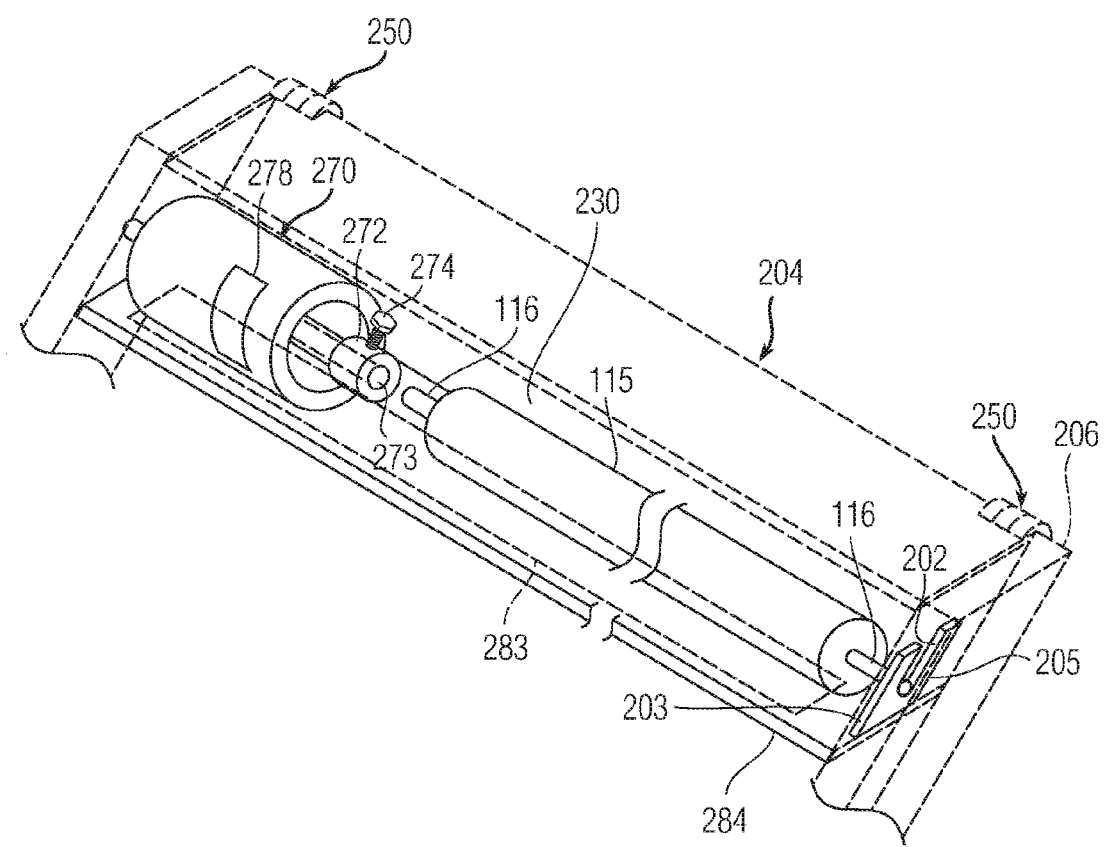
FIG. 4 is a front, top, right side perspective enlarged broken away view of the housing according to the first embodiment showing the replaceable roller.

The roller 115 is located in a roller mount space 230 in the top of the housing and is connected to a motor 270. The connection of the roller to the motor may determine in part the structure of the roller mount. In particular, in FIG. 4 the roller 115 may have cylindrical shafts 116 extending from each end. One of these shafts would be captured in the motor 270, which is positioned axially with respect to the roller. The capture may be by way of an extension 272 to the central shaft of the motor which has a recess 273 that receives the cylindrical shaft 116 of the roller. The roller shaft may be held in place by a transverse screw 274 through the motor shaft extension at the location of the roller shaft. The screw 274 can be eliminated if the recess 273 and the shaft 116 are square or some other polygonal shape. The other end of the roller also has a shaft 116, preferably cylindrical, which is free to rotate in a slot 202 of a piece 203 attached to the housing side. The roller 115 is accessible through a top flap 204 or a side door 206 of the housing. In one embodiment, shown in FIGS. 2 and 3, the top flap 204 of the housing 200 has hinges 250 such that a consumer can open the housing and add or remove the roller 115. The roller is held in the top of the housing by a band clip 278, and does not require professional or custom installation. With the top flap 204 open the user can pull the motor up out of the clip 278 so the roller is cocked. The screw 274 is loosened and the roller 115 replaced. As an alternative, a roller with an internal motor M can be used, as shown in dotted line in FIG. 2. In that case the roller may have cylindrical shafts that rest and rotate in open top slots 202 at each end, so the construction is much simpler. Latches 205 can be used to hold the roller shafts in the slots. To change rollers, the latches are released and the motor roller lifted out of the top of the housing. A roller with an internal motor may also have stationary square or polygonal shafts that fit in the slots, but does not rotate. Instead the roller body is rotated by the motor with respect to the stationary end shafts. In such a case the slots should be designed (e.g., square) to prevent the end shafts from moving.

If side door 206 is used, opening the door releases the roller shaft at that end. Where a motor driven roller is used, the customer only needs to pull the roller out of the side door. The same is true where an axial motor is used with a square shaft that receives the square shaft of the roller.

In either construction, once the roller is removed it can be replaced by another roller with different artwork. Alternatively, if the cover is connected to the roller by a detachable structure, e.g., Velcro®, the artwork can be changed and the same roller reinstalled.

The roller 115 that uses the cover 110 to conceal and reveal the ultra-thin flat display panel 100 can operate as described in the '765 patent or '987 patent discussed above, both of which are incorporated herein in their entirety by reference. The cover typically has an image or design (referred to herein as "artwork") on its outward facing surface. The cover 110 should be large enough to completely cover the screen of the display unit 100. If needed, a matte 120 can be used to expose only the screen of the display unit 100 when the roller 115 is rolled up. By purchasing an oversize housing, the consumer can use the cover unit with a number of different sized flat panel displays. The space between the housing opening and the display panel is concealed with the matte 120. Should the user purchase a larger flat panel display they can use their existing cover by making a larger hole in the matte. If the flat panel display is close in size to the housing, a matte may not be needed.

The motor 270 is mounted so as to rotate the roller 115 in one direction or in the other in response to a control signal. The motor 270 can be activated in a variety of ways, including sensing the increase or decrease in current going to the video unit 100 (wherein the display unit has its electric plug placed into the sensing unit of the motorized unit). When the video unit 100 is turned on it draws more current, the motor is turned on and the cover moves up to reveal the display screen. The motor may also be turned on remotely or directly by receipt of a signal sent from an infrared or RF device, such as a remote control 140 (wherein the cover unit has a sensor on its outer surface that receives the signal and sends the activating infrared or RF signal to the motorized unit). See FIG. 2.

Figure 5:
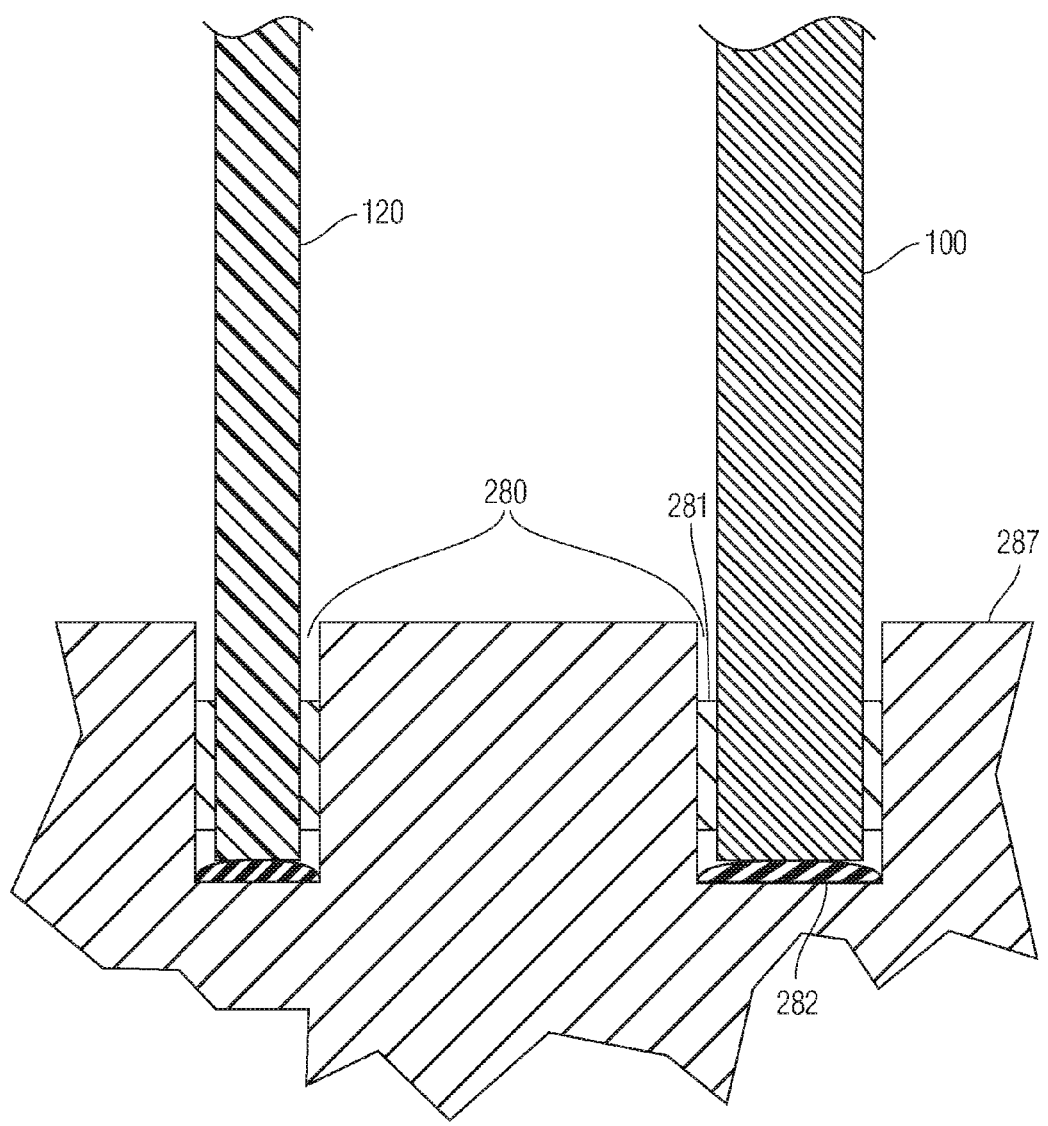
FIG. 5 is an enlarged broken cross-sectional side view of the grooved mounting channel of the present invention.

As shown in FIGS. 3 and 5, at the bottom of the housing 200 are grooved mounting channels 280 in which both a matte 120 and display unit 100 can be placed by placing or sliding them into the housing, e.g., through side opening 260 in the housing. The lower ledge of the grooved mounting channel 280 bears the weight of the display unit 100 and matte 120, as well as secures them. In certain embodiments, referring to FIG. 5, the lower ledge of the grooved channel 280 is covered with a material 282, such as rubber, to prevent sliding of the video unit 100. In other embodiments, shims 281 are used to secure the matte 120 and display unit 100 in place and ensure that the display unit 100 is flush against the frame 130, housing 200 and matte 120 for proper appearance. Both the display unit 100 and the matte 120 are held in place by the grooved mounting channels 280 and hinges 289 which slide over or clamp onto the matte 120 and display unit 100 once the matte and display unit are in place. Other suitable locking or clamping devices can be used to secure the display unit 100 and the matte 120, such as spring clamps 288 shown in FIG. 2. Other embodiments may have grooved mounting channels 280' on one or more sides 240 of the housing. A consumer will be able to easily insert and remove the matte 120, display unit 100, or both, without the aid of a skilled technician. This is advantageous if the display panel 100 breaks and needs to be replaced, or if the consumer decides to change display panel size. As discussed in the '400 publication, a matte 120 can be used so that a single frame can accommodate a variety of display screen and art print sizes.

In an alternative arrangement, the matte and display can be inserted from the top of the housing. In such an arrangement, slots or one or more openings 283 (shown in dotted line in FIG. 4) are provided in the upper platform 284 upon which the motor 270 rests. Installation is achieved by lifting the flap 204, removing the roller 115 and perhaps the motor to gain access to the one or more openings 283 in platform 284. The display panel and/or matte can then be slid downwardly into the housing to engage the channels 280 at the bottom of the housing. As an alternative or in addition, the panel and matte can engage additional channels 280' in the housing side walls 240.

Similarly, the matte and display can be inserted from the bottom of the housing. In such an arrangement the bottom portion of the housing 264 is made separable along line 286 in FIG. 3. This bottom portion is removed and the matte and display are inserted.

In some instances the flat panel display may not have a uniform thickness. In such a case the slots 280 can be made large enough to accommodate the thickest display accommodated by the unit. Then clamps, such as spring clamps 288 or hinges 289, are used to securely mount it in the slots. The clamps may be connected to one or more sides 240 or the top of the housing. These clamps are flexible and can be pried open to the desired thickness to secure the flat panel display. In FIG. 2, for example, the clamp 288 is connected to side 240 and can slide onto or clip over the flat panel display 100 and/or matte 120. FIG. 3 illustrates an exemplary hinge 289, which can slide onto or clip over the flat panel display 100 and/or matte 120. In other embodiments, the clamps are not connected to the housing, but rather are free to be placed at any location on the flat panel display so as to secure it in the slots. As an alternative, the display can be placed on top of the platform 287 and not in the slots. In such an arrangement the display will still have to be secured by clamps.

Referring to FIG. 3, at the rear of the housing, provision is made for the placement of any wires or cables from the display unit. In certain embodiments, an aperture 600 is located in the center or near the lower edge of the rear of the housing through which the wires or cables 610 are to be threaded. The wires or cables 610 can then be directed into a wall or simply dropped down below the cover unit to be led to an electric outlet or other source of signals and data for the display unit. Speakers and audio systems can also be connected through such apertures 600.

On the exterior of the front of the housing, a frame 130 is mounted. The sides of the housing 240, shown in FIG. 2, can have a decorative trim so as to cover the space between the front edge of the housing and the wall upon which the cover unit is mounted or hung. The decorative trim can also hide any wires or cables. Alternatively, the sides of the housing 240 can remain uncovered. Uncovered sides may be desirable for consumers who wish to mount the housing in a location where the sides of the units will not be visible. For example, the housing can be mounted in a recess in the wall as shown in U.S. Pat. No. 5,264,765. Electrical power distribution to the display panel and motor may be contained in a box 266 at the bottom of the housing.

As best shown in FIG. 3, brackets 300 at the top and 400 at the bottom of the housing are fastened to the wall by screws 500. These brackets have upwardly open slots into which flanges 210, 220 of the housing are received. As a result, the weight of the housing and its supported flat panel display, matte and roller, is held up by the brackets.

Figure 6:
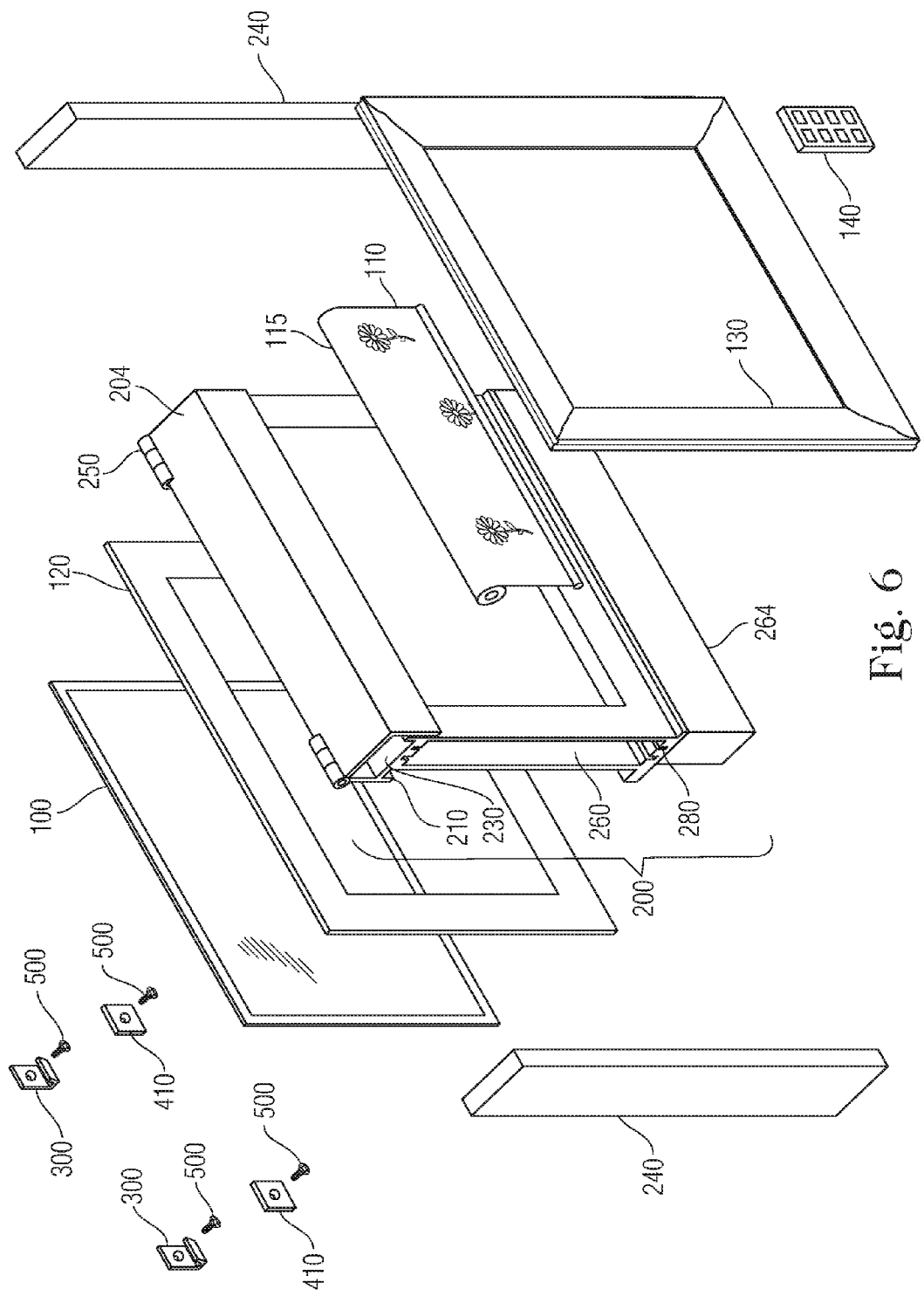
FIG. 6 is an exploded perspective view of the present invention according to a second embodiment with two mounting brackets and blocks.
Figure 7:
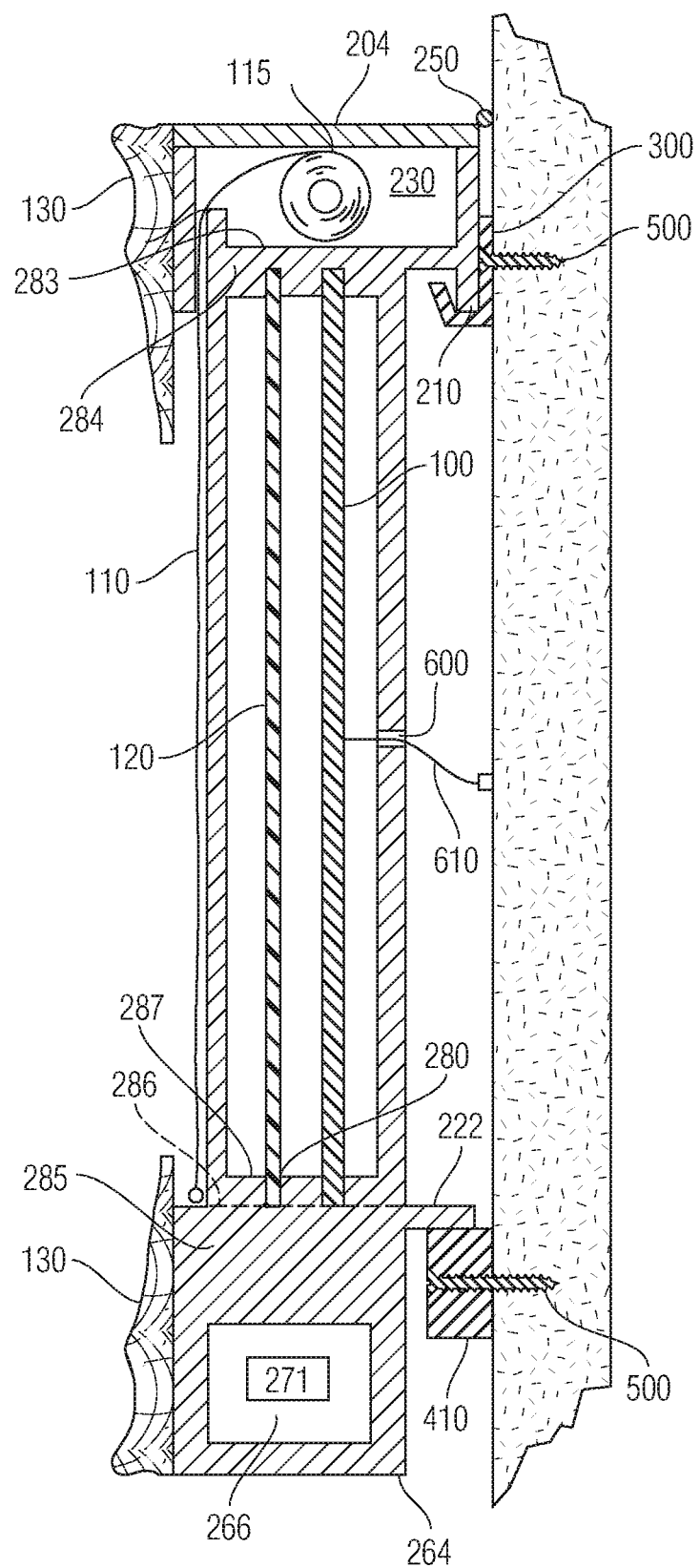
FIG. 7 is a cross-sectional side view of the present invention according to the second embodiment with two mounting brackets and blocks.

In a second embodiment, as shown in FIGS. 6-8 only two mounting brackets 300 are used. The mounting brackets 300 are located at the two top corners of the housing. Sizing blocks 410 are mounted at the bottom two corners of the housing to enable a flat and evenly spaced mount to a wall. The top flange 210 is similar to that shown in FIG. 3. The bottom flange 222 in this embodiment is made to rest on the sizing block 410. In other respects the second embodiment is similar to the first. While the first and second embodiments utilize a specific number of brackets and sizing blocks, it will be appreciated by those skilled in the art that any number of brackets or sizing blocks or even a mounting bar can be used that have sufficient strength to support the weight of the housing and its supported flat panel display, matte and roller. Furthermore, the brackets and sizing blocks can be placed at any location on the frame, and do not need to be in the corners of the frame as shown in FIGS. 2 and 6.

Figure 9:
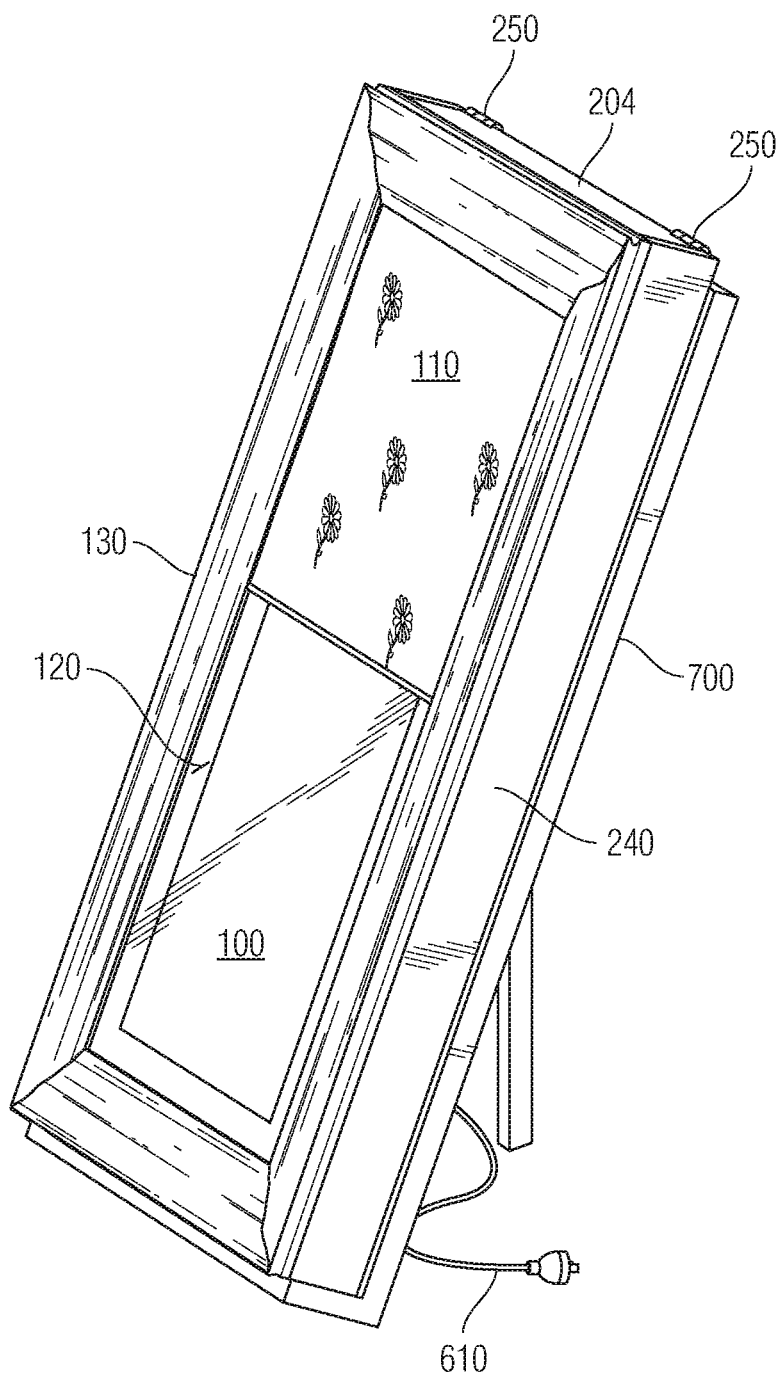
FIG. 9 is a perspective view of a third embodiment of invention in the form of a cover unit mounted on an easel instead of the wall.
Figure 10:
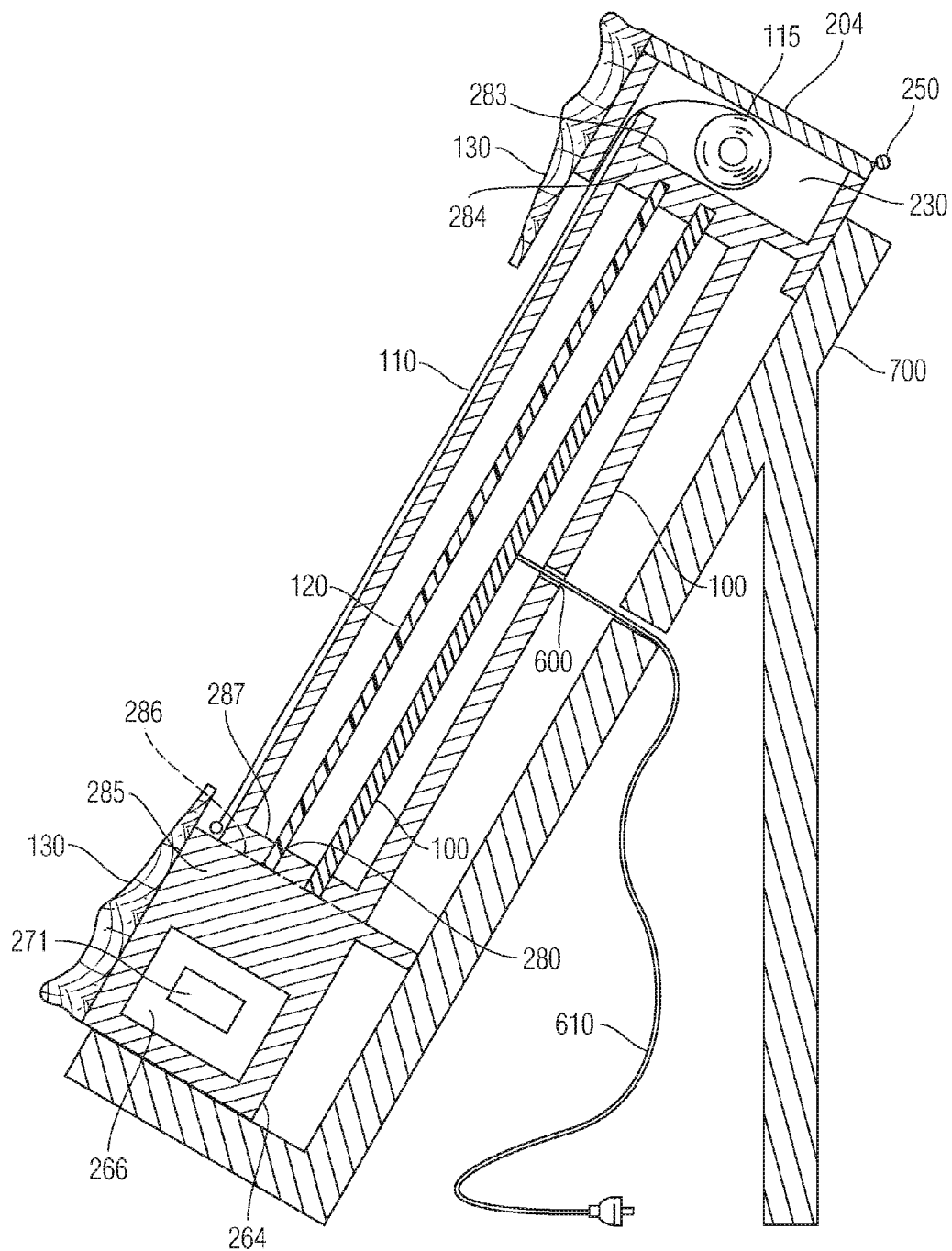
FIG. 10 is a cross-sectional side view of the third embodiment in which the cover unit is supported by an easel.

In a third embodiment, as shown in FIGS. 9 and 10, the cover unit rests on an easel 700 on a table or floor so that it looks like a picture, rather than being hung on a wall.

While the present invention has been particularly shown and described with reference to preferred embodiments thereof; it will be understood by those skilled in the art that various changes in form and details may be made therein without departing from the spirit and scope of the invention.

What we claimed is:
1. A cover unit for a flat screen video display comprising:
a housing having a generally rectangular shape with a front surface and a rear surface separated by a portion of the housing so that it has a relatively thin flat structure, said housing further having top and bottom surfaces;
a roller mounted in a top portion of the housing;
a cover mounted on said roller, said cover having indicia, such as art work, on a surface thereof;
a motor mounted so as to rotate the roller in one direction or the other in response to a control signal, when the roller is rotated in one direction the cover is rolled up on the roller and when the roller is rotated in the opposite direction the cover is unrolled;
a matte received within a matte slot within the bottom surface of the housing and located toward the front surface, said matte having an opening that can be sized;
a cover slot in the housing in front of the matte slot and toward the front surface in which the cover may roll up and down;
a flat video display slot in the bottom surface of the housing which is wide enough for a lower edge of a flat screen video display to be mounted therein and supported behind the matte slot toward the housing rear surface, the cover being large enough to completely cover a screen of the flat screen video display, and the matte being sized to expose only the screen of the flat screen video display when the roller is rolled up on the roller; and
mounting hardware on the rear surface of the housing for attaching the housing to a wall, wherein said matte slot and flat video display slot are grooved mounting channels in the bottom surface of the housing.
2. The cover unit according to claim 1, further comprising anti-sliding material in the lower edge of the grooved mounting channels.

3. The cover unit according to claim 1, further comprising at least one hinge, wherein said hinge slides over or clamps onto the matte or flat video display when mounted in grooved mounting channel.

4. The cover unit according to claim 1, further comprising at least one spring clamp extending from a side of the housing, wherein said spring clamp engages the side of the matte or flat video display and secures the matte or flat video display in the grooved mounting channel.

5. The cover unit according to claim 1, further comprising power supplies, wherein said power supplies are contained in a lower portion of the housing.

6. The cover unit according to claim 1, further comprising a hinged top flap or side door in the housing, wherein said flap or door may be opened to provide access to the roller.

7. The cover unit according to claim 1, further comprising a band clip, wherein said band clip secures the motor.

8. The cover unit according to claim 1, wherein the motor is located internal to the roller.

9. The cover unit according to claim 1, further comprising an exterior cover unit sensor adapted to respond to an infrared or RF device providing the signal to the motor.

10. The cover unit according to claim 1 further comprising a roller mount fixed in the top portion of the housing in which the roller is mounted.

11. The cover unit according to claim 1 wherein the cover can be replaced by one of a variety of covers having different indicia.

12. The cover unit according to claim 1 further comprising a frame mounted on an exterior of the front surface of the housing so as to give the appearance of framed art work when the cover is down.

13. A cover unit for a flat screen video display comprising:
a housing having a generally rectangular shape with a front surface and a rear surface separated by a portion of the housing so that it has a relatively thin flat structure, said housing further having top and bottom surfaces;
a roller mount fixed in the top of the housing;
a roller which may be received in the roller mount;
one of a variety of covers that may be mounted on said roller, each cover of the variety of covers having different indicia, such as art work, on a surface thereof which when the roller is rotated in one direction causes the cover to be rolled up on the roller and when the roller is rotated in the opposite direction the cover is unrolled down;
a motor mounted so as to rotate the roller in one direction or the other in response to a control signal;
a frame mounted on an exterior of the front surface of the housing;
a matte slot within-the bottom surface of the housing and located opposite the frame, said matte slot receiving a matte which can be sized;
a cover slot in front of the matte slot in which the cover may roll up and down;
a flat video display slot in the bottom surface of the housing which is wide enough for a lower edge of a flat screen video display to be mounted therein and supported behind the matte slot, the cover being large enough to completely cover a screen of the flat screen video display slot, and the matte being sized to expose only the screen of the flat screen video display when the roller is rolled up on the roller; and
mounting hardware on the rear surface of the housing, which hardware may be attached onto a wall so as to support the cover unit on the wall, wherein said matte slot and flat video display slot are grooved mounting channels in the bottom surface of the housing.

14. A video display unit comprising a flat screen video display and a cover unit as claimed in claim 1.

15. A cover unit for a flat screen video display comprising:
a housing having a generally rectangular shape with a front surface and a rear surface separated by a portion of the housing so that it has a relatively thin flat structure, said housing further having top and bottom surfaces;
a roller mounted in a top portion of the housing;
a cover mounted on said roller, said cover having indicia, such as art work, on a surface thereof;
a motor mounted so as to rotate the roller in one direction or the other in response to a control signal, when the roller is rotated in one direction the cover is rolled up on the roller and when the roller is rotated in the opposite direction the cover is unrolled;
a matte received within a matte slot within the bottom surface of the housing and located toward the front surface, said matte having an opening that can be sized;
a cover slot in the housing in front of the matte slot and toward the front surface in which the cover may roll up and down;
a flat video display slot in the bottom surface of the housing which is wide enough for a lower edge of a flat screen video display to be mounted therein and supported behind the matte slot toward the housing rear surface, the cover being large enough to completely cover a screen of the flat screen video display, and the matte being sized to expose only the screen of the flat screen video display when the roller is rolled up on the roller;
mounting hardware on the rear surface of the housing for attaching the housing to a wall, wherein said matte slot and flat video display slot are grooved mounting channels in the bottom surface of the housing; and
at least one spring clamp which engages the side of the matte or flat video display and secures the matte or flat video display in the grooved mounting channel.

16. The cover unit according to claim 15, wherein said spring clamp connects to the housing.

* * * * *